(12) United States Patent
Yasukawa et al.

(10) Patent No.: US 8,729,403 B2
(45) Date of Patent: May 20, 2014

(54) ELECTRONIC APPARATUS

(75) Inventors: Daisuke Yasukawa, Hitachinaka (JP);
Kazuhiko Nakano, Isesaki (JP);
Hirofumi Watanabe, Isesaki (JP);
Atsushi Yamaguchi, Isesaki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 268 days.

(21) Appl. No.: 13/232,338

(22) Filed: Sep. 14, 2011

(65) Prior Publication Data

US 2012/0067638 A1    Mar. 22, 2012

(30) Foreign Application Priority Data

Sep. 22, 2010   (JP) ................................. 2010-211978

(51) Int. Cl.
*H05K 1/11* (2006.01)
*H05K 1/16* (2006.01)
*H01R 9/00* (2006.01)
*H01R 13/40* (2006.01)

(52) U.S. Cl.
USPC ........... 174/261; 174/260; 174/263; 174/267; 361/772; 439/733.1

(58) Field of Classification Search
USPC ........... 29/837, 839–840, 843; 174/260, 261; 439/67, 70, 71, 77, 733.1; 361/772, 361/785, 791
See application file for complete search history.

(56) References Cited

U.S. PATENT DOCUMENTS

| 4,088,828 | A | * | 5/1978 | Yamamoto et al. ........... 174/263 |
| 4,694,121 | A | * | 9/1987 | Ota ............................... 174/250 |
| 4,835,345 | A | * | 5/1989 | Haarde ......................... 174/263 |
| 5,604,333 | A | * | 2/1997 | Kennish et al. ............... 174/261 |
| 5,679,929 | A | * | 10/1997 | Greenfield et al. ........... 174/261 |
| 6,095,872 | A | * | 8/2000 | Lang et al. ................... 439/733.1 |
| 6,292,372 | B1 | * | 9/2001 | Lin et al. ....................... 361/760 |
| 6,407,342 | B1 | * | 6/2002 | Lee et al. ...................... 174/260 |
| 2007/0173134 | A1 | * | 7/2007 | Takahashi et al. .......... 439/733.1 |
| 2009/0176402 | A1 | * | 7/2009 | Honda .......................... 439/377 |

FOREIGN PATENT DOCUMENTS

| JP | 4-93182 | | 8/1992 |
| JP | 2003331960 | A * | 11/2003 |
| JP | 2003-331960 | | 11/2006 |

OTHER PUBLICATIONS

Machine Translation of JP 2003-331960A: Kobayashi T; Electronic component e.g. integrated circuit, connector has terminal; Nov. 21, 2003.*

Japanese Office Action for Japanese Application No. 2010-211978, issued on Jul. 31, 2012.

* cited by examiner

*Primary Examiner* — Timothy Thompson
*Assistant Examiner* — Sherman Ng
(74) *Attorney, Agent, or Firm* — Antonelli, Terry, Stout & Kraus, LLP.

(57) ABSTRACT

First and second terminals project from a circuit board and lie adjacent to each other with an interspace formed between the first and second terminals. An electronic apparatus further includes a projecting member projecting along a neighboring terminal which is one of the first and second terminals at such a position that the neighboring terminal is located between the projecting member and the interspace. The projecting member is located at an adjacent position adjacent to the neighboring terminal, to attract molten solder from the interspace toward the projecting member during soldering to join the first and second terminals to the circuit board.

17 Claims, 4 Drawing Sheets

ELECTRONIC APPARATUS

BACKGROUND OF THE INVENTION

The present invention relates to electronic apparatus such as electronic control apparatus for controlling an electronic device, and more specifically to electronic apparatus including an electronic circuit formed by soldering an electronic component to a circuit board.

Patent document JP2003-331960A shows technique for soldering terminals of an electronic component to a circuit board of electronic control apparatus. In this technique, terminals projecting from the circuit board are so arranged that adjacent two of the terminals are unequal in projecting length to differentiate forces for retaining a molten solder adhered to the terminals and thereby to prevent formation of solder bridge and solder ball.

SUMMARY OF THE INVENTION

In the arrangement of the above-mentioned patent document, however, a pulling force becomes insufficient if the distance between two adjacent terminals is short, and the arrangement might become unable to prevent solder bridging.

Therefore, it is an object of the present invention to provide a technique to prevent solder bridging even if the distance between two adjacent terminals is set shorter.

According to one aspect of the invention, an electronic apparatus such as an electronic control apparatus comprises first and second terminals and a projecting member. The first and second terminals projects from a circuit board and lie adjacent to each other with an interspace formed between the first and second terminals. The projecting member projects along a neighboring terminal which is one of the first and second terminals at such a position that the neighboring terminal is located between the projecting member and the interspace, and the projecting member is located at an adjacent position adjacent to the neighboring terminal, to attract molten solder from the interspace toward the projecting member during soldering to join the first and second terminals to the circuit board.

DETAILED DESCRIPTION OF THE INVENTION

In following embodiments, an electronic apparatus is an electronic control apparatus including a control unit for a brake system of a motor vehicle.

A control unit for a brake system includes a first end fixed to a bulkhead separating an engine compartment and a passenger compartment, and a second end provided with a drive mechanism including a master cylinder which, in this example, a tandem master cylinder, and an electronic control unit (ECU) 1 for controlling an electric actuator in the drive mechanism.

Figure 2:
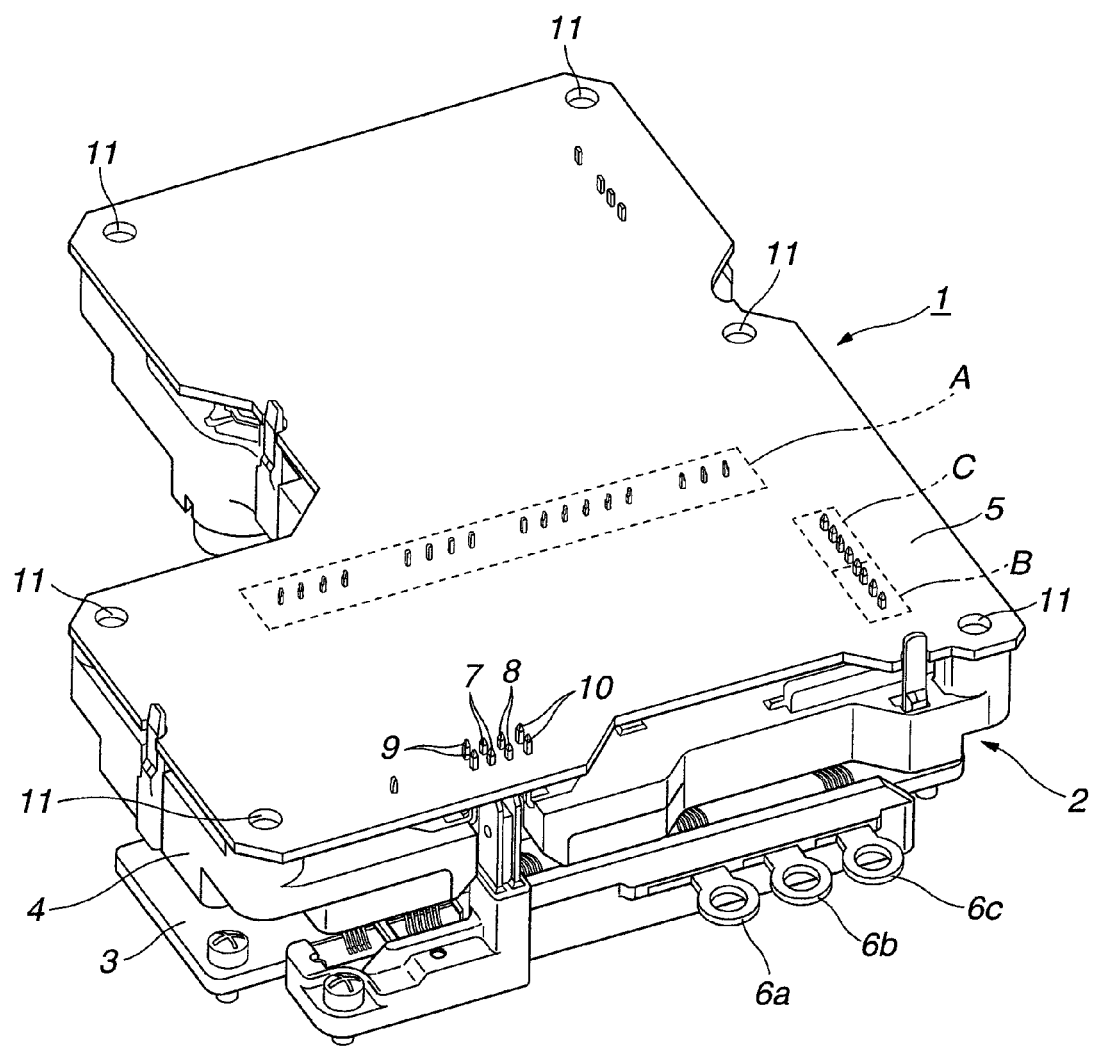
FIG. 2 is a perspective view showing the electric apparatus according to the first embodiment.

As shown in FIG. 2, the ECU 1 includes an electronic circuit 2 enclosed in an ECU casing (not shown).

As shown in FIG. 2, the electronic circuit 2 includes a power board 3 (or power substrate) for supplying power to a stator of electric motor, a bus bar assembly 4 including a filter electronic circuit for removing current noise, and a control board 5 (or control substrate) which is a circuit board for controlling the drive of the electric motor.

The power board 3 is formed of a synthetic resin in the form of an approximately rectangular thin plate. Power board 3 includes a plurality of semiconductor devices (not shown) as electronic components, ac input terminal (not shown), motor three-phase terminals 6a~6c, and source terminals including a first positive terminal 7 and a first negative terminal 8.

The bus bar assembly 4 is a plate-shaped member of a synthetic resin formed integrally by molding. A male connector (not shown) is fixed to one side of bus bar assembly 4. A resolver connector faces from a bottom surface of bus bar assembly 4.

The male connector is adapted to be connected with a female connector (not shown) having one end connected with a battery power source. Furthermore, components mounted on bus bar assembly 4 includes a relay circuit that is a constituent component of the filter electronic circuit, MOS FET, shunt resistor, common mode coil, and normal mode coil.

Bus bar assembly 4 includes a second positive terminal 9 to be connected with the first positive terminal 7 of power board 3, and a second negative terminal 10 to be connected with the first negative terminal 8 of power board 3. These terminals are arranged to supply power from the bus bar assembly 4 to the power board 3.

The control board 5 is an L-shaped thin plate member of a synthetic resin. Control board 5 is fixed to an upper side of bus bar assembly 4 by screws or screw fasteners (not shown) inserted through screw holes 11. In the example shown in FIG. 2, control board 5 includes six of the screw holes 11 formed at corners and distributed at predetermined intervals in a marginal region forming a periphery of an L-shaped surface of control board 5. Control board 5 is fixed to bus bar assembly 4 by six screws inserted, respectively, through the six screw holes 11.

A control circuit including a computer is attached to the control board 5. The control circuit is configured to produce a control signal to control the drive of an inverter (a semiconductor device) of the driver circuit of the electric motor.

In a central region of control board 5, there is provided a terminal group A including a plurality of terminals for connecting the control board 5 with the power board 3 by soldering. The control signal is transmitted through these terminal pins to power board 3 and used for driving the inverter.

In one side portion of control board on the side on which the female connector is disposed, there are provided a positive side source terminal group B and a negative side source terminal group C for receiving supply power from the male connector.

The positive side source terminal group B includes a connector side positive terminal and a positive terminal connected with a positive side wiring of the bus bar assembly 4. These terminals are connected electrically by soldering.

The negative side source terminal group C includes a connector side negative terminal and a negative terminal connected with a negative side wiring of the bus bar assembly 4, and these terminals are connected electrically by soldering, like the positive side source terminal group B.

The control board 5 is connected with the terminal pins of power board 3 by soldering, as mentioned before. The following explanation is directed to soldering of the first positive terminal 7 and second positive terminal 9 and soldering the first negative terminal 8 and second negative terminal 10, as typical terminal pins.

Figure 1:
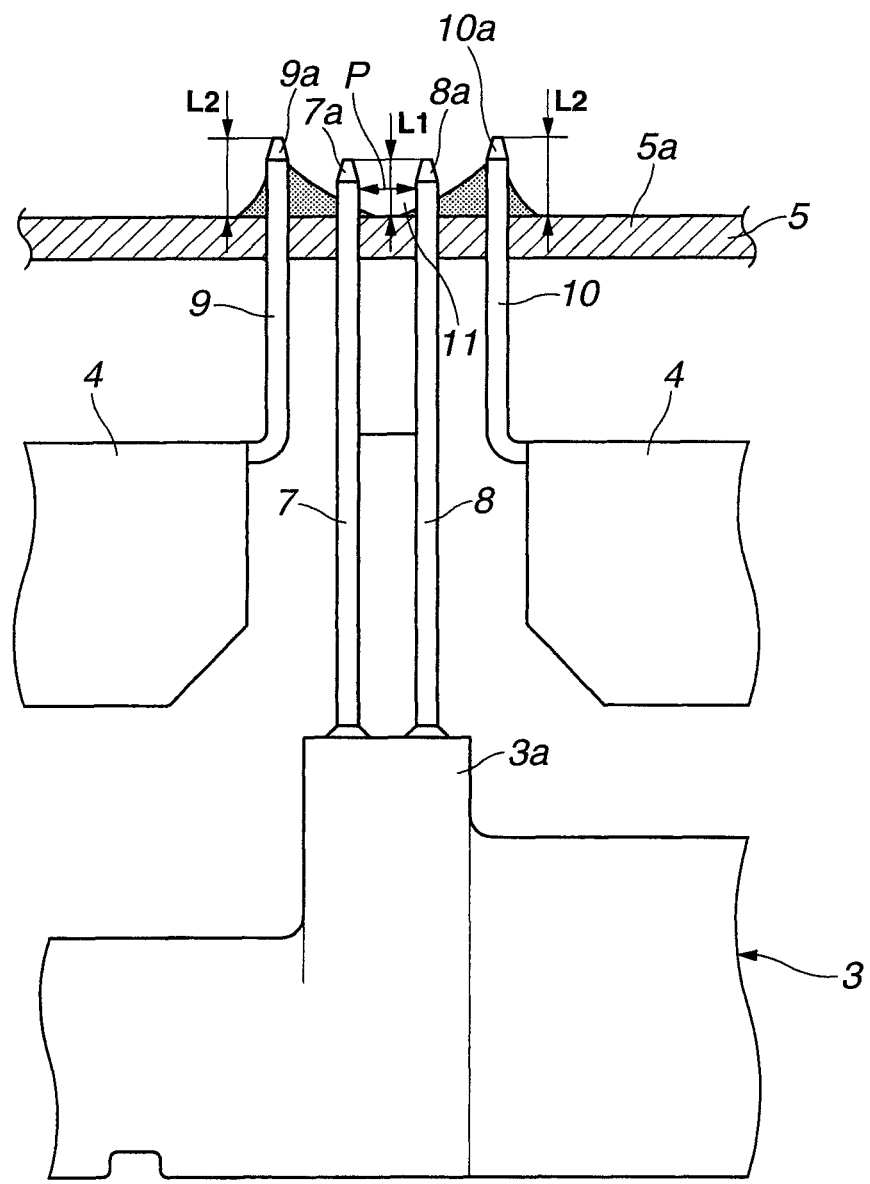
FIG. 1 is a sectional view showing a main portion of an electronic apparatus according to a first embodiment of the present invention.
Figure 3:
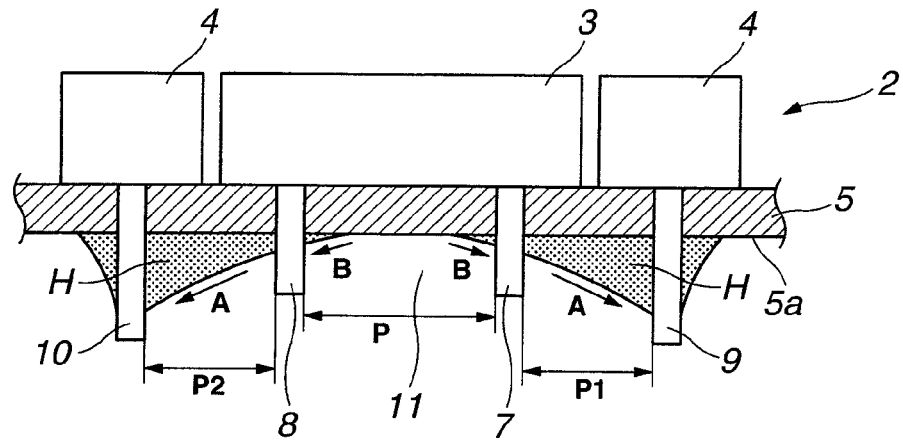
FIG. 3 is a sectional view schematically showing a terminal arrangement according to the first embodiment.

In the example shown in FIG. 2, there are provided two of the first positive terminals 7, two of the first negative terminals 8, two of the second positive terminals 9 and two of the second negative terminals 10, so that there are a total of eight terminal pins arranged in two rows each including four terminal pins and extending laterally side by side. FIG. 1 and FIG. 3 show only one of the two rows as viewed from one side, for the sake of simplicity, and the explanation is directed to the four terminals shown in these figures for the sake of convenience.

As the soldering method, in general, there are dip type soldering and jet wave soldering. This embodiment employs the dip type soldering.

Each of the first positive and negative terminals 7 and 8 and the second positive and negative terminals 9 and 10 in the illustrated example is a metallic member of metallic material such as copper, formed in a shape having a rectangular cross section. The terminal row shown in FIG. 1 includes the second positive terminal 9, first positive terminal 7, first negative terminal 8 and second negative terminal 10 arranged in a row from left to right in FIG. 1. Each of the terminals 7~10 is in the form of a terminal pin having a tip end 7a~10a tapered so as to facilitate insertion into a hole in the control board 5. In the illustrated example shown in FIG. 1, the first (inner) positive and second positive terminals 7 and 8 are located between the second (outer) positive and negative terminals 9 and 10, and the second positive and negative terminals 9 and 10 on the outer side are arranged to function as projecting member(s) or third terminal(s).

The first positive and negative terminals 7 and 8 are adjacent to each other in the row extending in the left and right direction, between the second positive and negative terminals 9 and 10. First positive and negative terminals 7 and 8 project upwards from a power supply portion 3a provided in the power board 3, as shown in FIG. 1. The length of each of the first positive and negative terminals 7 and 8 from the lower end to the upper end is substantially equal to the length of the other. Each of the first positive and negative terminals 7 and 8 extends through the control board 5, and projects upwards from an upper surface 5a of the control board 5. A projection length L1 of each of the first positive and negative terminals 7 and 8 from the upper surface 5a of control board 5 is substantially equal to the projection length of the other. Accordingly, the heights of the tip ends 7a and 8a are substantially equal to each other. The projection length L1 of the first positive and negative terminals 7 and 8 is relatively short In the illustrated example shown in FIG. 1, the first positive terminal 7 is arranged to function as a first terminal, and the first negative terminal 8 is arranged to function as a second terminal.

An interspace or clearance 11 is formed between the first (inner) positive and negative terminals 7 and 8 arranged between the second (outer) positive and negative terminals 9 and 10 in the row of the four terminals 9, 7, 8, 10. Second positive and negative terminals 9 and 10 are connected with power supply wiring in the bus bar assembly 4. Specifically, the second positive terminal 9 is connected with a positive side wiring, and the second negative terminal 10 is connected with a negative side wiring.

Second positive and negative terminals 9 and 10 project upwards. The length of each of the second positive and negative terminals 9 and 10 from the lower end below the control board 5 to the upper end above the control board 5 is substantially equal to the length of the other. Each of the second positive and negative terminals 7 and 8 extends through the control board 5 and projects upwards from the upper surface 5a of the control board 5. A projection length L2 of each of the second positive and negative terminals 9 and 10 from the upper surface 5a of control board 5 is substantially equal to the projection length of the other. Accordingly, the heights of the tip ends 9a and 10a are substantially equal to each other. The projection length L2 of second positive and negative terminals 9 and 10 is greater than the projection length L1 of first positive and negative terminals 7 and 8. In the illustrated example shown in FIG. 1, the first positive terminal 7 is arranged to function as a first terminal, and the first negative terminal 8 is arranged to function as a second terminal. In this example, the projection length L2 is greater than the projection length L1 by about 1 mm. Each of the longer second positive and negative terminals 9 and 10 having the longer projection length L2 has a broader surface area which increases the surface tension.

The second positive and negative terminals 9 and 10 may be connected with a single electronic component, and projected upwards from the same electronic component. Alternatively, the second positive and negative terminals 9 and 10 may be connected, respectively, with two different electronic components, and projected upwards, respectively, from the two different electronic components. This is true in the other embodiments (second to sixth embodiments).

The first positive and negative terminals 7 and 8 are formed by cutting to have a uniform shorter length. Similarly, the second positive and negative terminals 9 and 10 are formed by cutting to have a uniform longer length. The thus-formed terminals 7, 8, 9 and 10 are used commonly to other electronic circuits 2.

In the illustrated example, the first positive and negative terminals (or leads) 7 and 8 are in the form of a straight bar or rod extending in parallel to each other. In the illustrated example, the cross sectional shape of each of first positive and negative terminals 7 and 8 is uniform from the lower end below the control board 5 to the upper end above the control board 5, except for the tapered tip end 7a or 8a. Similarly, in the illustrated example, the second positive and negative terminals (or leads) 9 and 10 are in the form of a straight bar or rod extending in parallel to each other. In the example of FIG. 1, the lower end portion of each of second positive and negative terminals 9 and 10 are bent. In the illustrated example, the cross sectional shape of each of second positive and negative terminals 9 and 10 is uniform from the lower end below the control board 5 to the upper end above the control board 5, except for the tapered tip end 9a or 10a.

The first positive and negative terminals 7 and 8 are positioned as close to each other as possible, and a pitch (or spacing) P of the interspace 11 between first positive and negative terminals 7 and 8 is minimized. The reason for reducing the pitch P is for restraining noises by cancelling electric inductances at the time of energization. However, the reduction of the pitch P between the first positive and negative terminals 7 and 8 tends to increase the possibility of solder bridge and solder ball in the interspace 11 during an operation of soldering to the upper surface 5a of control board 5.

Therefore, the second positive and negative terminals 9 and 10 are configured to have the longer projection length L2, as a means for increasing the surface area, and arranged near the first positive and negative terminals 9 and 10, respectively, to attract a molten solder from the first positive and negative terminals 7 and 8 having the shorter projection length L1, toward the second positive and negative terminals 9 and 10 by utilizing a greater surface tension, and thereby to prevent generation of solder bridge and solder ball between the first positive and negative terminals 9 and 10.

The first positive and negative terminals 7 and 8 are adjacent terminals which are not to be connected by soldering though the first positive and negative terminals 7 and 8 are formed close to each other. The first positive and negative terminals 7 and 8 are arranged so that the projection lengths are equal to each other or so as to reduce a difference between the projection lengths and to equalize the conditions for the surface tension to generate substantially equal surface tensions.

Second positive and negative terminals 9 and 10 connected by soldering, respectively, with first positive and negative terminals 7 and 8 are configured so that the projection length L2 is longer than that of first positive and negative terminals 7 and 8. Conversely, the projection length L1 of first positive and negative terminals 7 and 8 is shorter than the projection length L2 of second positive and negative terminals 9 and 10.

The terminals 7~10 are fixed to the control board 5 by a following process. FIG. 3 is a schematic view showing the electronic circuit 2 shown in FIG. 1 in a working state during a soldering operation for soldering the first positive terminal 7 and first negative terminal 8 to control board 5.

First, as shown in FIG. 2, the power board 3, bus bar assembly 4 and control board 5 are superposed in a laminated or layered state, and united into a unit of the electronic circuit 2, by a plurality of fastening devices such as bolts.

Then, the thus-formed electronic circuit 2 is positioned in an inverted state (upside down) as shown in FIG. 3, above a molten solder bath (not shown), by a support mechanism (not shown), and the terminals 7~10 are submerged in the molten solder. When, from this state, the molten solder surface is lowered, the shorter projected first positive and negative terminals 7 and 8 having the shorter projection length L1 are first separated from the molten metal layer while a surplus amount of the molten solder adhered to the terminals 7 and 8 drips off.

Thereafter, the longer projected second positive and negative terminals 9 and 10 are separated from the molten solder layer with a surplus amount of the adhered molten solder dripping off similarly.

During this, each of the longer projected second positive and negative terminals 9 and 10 causes a greater surface tension and generates a greater force attracting the molten solder H. Therefore, the molten solder H adhering to the shorter projected first positive and negative terminals 7 and 8 is attracted as shown by arrows A toward the longer projected second positive and negative terminals 9 and 10. Simultaneously, the molten solder H in the interspace 11 between the first positive and negative terminals 7 and 8 is pulled by the great attracting force as shown by arrows B, separately on the first positive terminal's side and the first negative terminal's side. Thus, the molten solder is separated and a so-called peel-back is performed.

By this operation, the first positive terminal 7 and second positive terminal 9 are connected by soldering, and the first negative terminal 8 and second negative terminal 10 are connected by soldering. In the interspace 11 between first positive and negative terminals 7 and 8, no solder is left over, and generation of solder bridge and solder ball is prevented effectively.

Thus, the arrangement according to this embodiment can allow the reduction of the pitch P of interspace 11 between first positive and negative terminals 7 and 8, ensure the solder joining of the first positive and negative terminals 7 and 8 and second positive and negative terminals 9 and 10 to the control board 5 by utilizing the greater surface areas of second positive and negative terminals 9 and 10, and prevent generation of solder bridging and solder ball effectively.

Furthermore, the first positive and negative terminals 7 and 8 having the shorter projection length L1 act to prompt the molten solder in the interspace 11 to fall off during separation from the molten solder layer, and to facilitate the attraction of the molten solder by second positive and negative terminals 9 and 10 through first positive and negative terminals 7 and 8.

Therefore, the arrangement according this embodiment can promote separation of the molten solder in the interspace 11 and thereby prevent solder bridging effectively.

The first positive and negative terminals 7 and 8 are equal, in the projection length, to each other. Therefore, as compared to an arrangement using positive and negative terminals having different projection lengths, the arrangement can improve the production efficiency and prevent increase of the production cost.

First positive terminal 7 is identical in polarity to second positive terminal 9 as a projecting member. First negative terminal 8 is identical in polarity to second negative terminal 10 as a projecting member. Therefore, it is possible freely to set the pitch P1 between first and second positive terminals 7 and 9 and the pitch P2 between first and second negative terminals 8 and 10. Consequently, it is possible to set the positions of these terminals at best points to maximize the force attracting the molten solder H with the surface tension from the first positive and negative terminals 7 and 8. This arrangement can further improve the separation of the molten solder in the interspace 11, and prevent solder bridging more efficiently.

Moreover, it is possible to uniformize the quantities of molten solder attracted to the positive side and the negative side by setting the positions of second positive and negative terminals 9 and 10 adequately. By equalizing the projection lengths of second positive and negative terminals 9 and 10 and equalizing the projection lengths of first positive and negative terminals 7 and 8, from the upper surface 5a of control board 5, the arrangement according to this embodiment make it possible to improve the uniformity of the quantities of molten solder attracted to the positive side and to the negative side.

In the illustrated example of this embodiment, the second positive and negative terminals 9 and 10 are disposed. However, it is optional to employ only either of the second positive and negative terminals 9 and 10. This arrangement including only one of second positive and negative terminals 9 and 10 can increase the force attracting the molten solder in the interspace 11 between first positive and negative terminals 7 and 8 and prevent solder bridging in the interspace 11.

Second Embodiment

Figure 4:
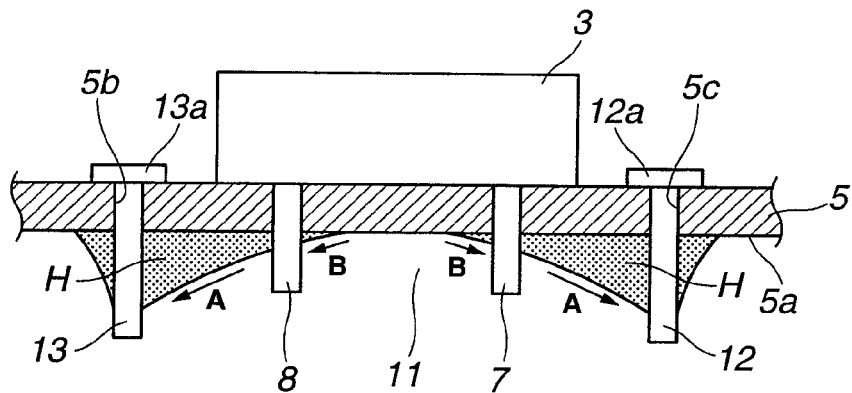
FIG. 4 is a sectional view schematically showing a terminal arrangement according to a second embodiment.

FIG. 4 shows an arrangement of terminals according to a second embodiment of the present invention. In the arrangement according to the first embodiment shown in FIG. 3, the second positive terminal 9 or/and the second negative terminal 10 serve as the projecting member projecting in a projecting direction (downwards as viewed in FIG. 3) along a neighboring terminal which is one of the first and second terminals (7, 8) at an adjacent position adjacent to the neighboring terminal, to attract molten solder, during soldering, from the interspace toward the projecting member. In the second embodiment, by contrast, the projecting member is not a positive or negative terminal connected with an electronic component provided in power board or bus bar assembly 4, but a projecting member fixed to the control board 5. In this example, the projecting member is at least one of projecting pins 12 and 13 of metallic material such as copper.

The projecting pins 12 and 13 of this example are identical, in material, cross sectional shape and projection length L2, to the second positive and negative terminals 9 and 10 according to the first embodiment. The projecting pins 12 and 13 are press fit, respectively, in fixing holes 5b and 5c opened in control board 5. Each of projecting pins 12 and 13 includes a flange (outward flange) 12a or 13a formed at a base end of the projecting pin and arranged to determine the amount of the press fitting, as shown in FIG. 4.

Each of projecting pins 12 and 13 is inserted through the fixing hole 5b or 5c opened through the control board 5. The projecting portion of the projecting pin 12 or 13 projects in the projecting direction (downwards as viewed in FIG. 4) from the surface 5a of the control board 5 on a first side of control board 5 whereas the flange 12a and 13a abuts against the opposite surface of control board 5 on a second side (upper side as viewed in FIG. 4) opposite to the first side (lower side as viewed in FIG. 4). The flange 12a or 13a limits the insertion of the projecting pin 12 or 13 and thereby determines the projection length L2 of the projecting portion on the first side of control board 5. In the other points, the second embodiment is substantially identical to the first embodiment.

In the second embodiment, too, during the soldering operation, each of the longer-projected projecting pins 12 and 13 (like the longer projected second positive and negative terminals 9 and 10) causes a greater surface tension and generates a greater force attracting the molten solder H. Therefore, the molten solder H adhering to the shorter projected first positive and negative terminals 7 and 8 is attracted as shown by arrows A toward the longer projected projecting pins 12 and 13. Simultaneously, the molten solder H in the interspace 11 between the first positive and negative terminals 7 and 8 is pulled by the great attracting force as shown by arrows B, separately on the first positive terminal's side and the first negative terminal's side. Thus, the molten solder is separated.

By this operation, the molten solder is cleared away from the interspace 11, and the molten solder is left over only at positions required to connect the first positive and negative terminals 7 and 8 and the projecting pins 12 and 13 to the upper surface 5a of control board 5. Thus, the arrangement of the second embodiment can prevent generation of solder bridge and solder ball effectively.

The first positive and negative terminals 7 and 8 provided in the power supply portion 3a at positions adjacent to each other are equal, in the projection length, to each other as in the first embodiment. Therefore, as compared to the arrangement using positive and negative terminals having different projection lengths, the arrangement of the second embodiment can improve the production efficiency and prevent increase of the production cost, like the first embodiment.

The arrangement including the two projecting pins 12 and 13 makes it possible to uniformize the quantities of molten solder attracted to the positive side and the negative side by setting the positions of the projecting pins 12 and 13 adequately. In the arrangement according to the second embodiment utilizing the projecting pin (12, 13) unrelated to positive and negative terminals, instead of the second positive or negative terminals 9 or 10, it is possible to set the projection length L2 and the size freely.

Third Embodiment

Figure 5:
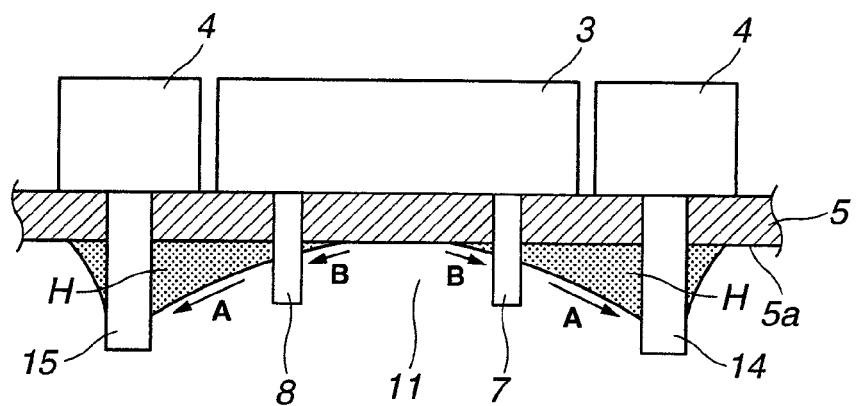
FIG. 5 is a sectional view schematically showing a terminal arrangement according to a third embodiment.

FIG. 5 shows an arrangement according to a third embodiment of the present invention. The arrangement of FIG. 5 is similar, in the basic structure, to the arrangement of FIG. 3 according to the first embodiment. In the third embodiment, however, second positive and negative terminals 14 and 15 are greater in cross sectional size than that of the first positive and negative terminals 7 and 8, unlike the second positive and negative terminals 9 and 10 of the first embodiment. For example, the second positive and negative terminals 14 and 15 are made greater in the outside diameter than that of the first positive and negative terminals 7 and 8, to further increase the outside surface area of each of terminals 14 and 15.

In the example shown in FIG. 5, the first positive and negative terminals 7 and 8 are projected to have the projection length L1, and the second positive and negative terminals 14 and 15 are projected to have the projection length L2 greater than the projection length L1, as in the arrangement of FIG. 3.

Thus, the arrangement including the second positive and negative terminals 14 and 15 having a greater surface area of the projecting portion and hence causing a greater surface tension can increase the attraction force pulling the molten solder H from the first positive and negative terminals 7 and 8, and prevent generation of solder bridging and solder ball in the interspace 11, effectively. It is optional to set the projection length L2 of second positive and negative terminals 14 and 15 substantially equal to the projection length L1 of first positive and negative terminals 7 and 8.

Fourth Embodiment

Figure 6:
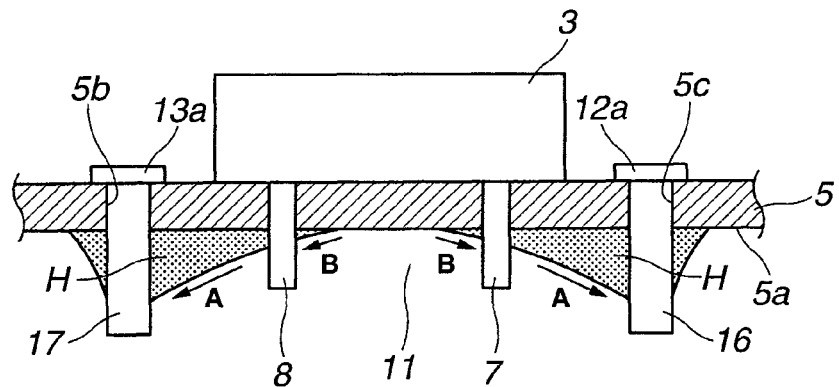
FIG. 6 is a sectional view schematically showing a terminal arrangement according to a fourth embodiment.

FIG. 6 shows an arrangement according to a fourth embodiment of the present invention. The arrangement of FIG. 6 including projecting pins 16 and 17 of a metallic material such as copper is similar, in the basic structure, to the arrangement of FIG. 4 including the projecting pins 12 and 13 of a metallic material such as copper according to the second embodiment. In the fourth embodiment, however, the projecting pins 16 and 17 are greater in cross sectional size than that of the first positive and negative terminals 7 and 8 unlike the projecting pins 12 and 13 according to the second embodiment. In this example, the projecting pins 16 and 17 are made greater in the outside diameter than that of the first positive and negative terminals 7 and 8, to increase the surface area. In the other respects, the apparatus of the fourth embodiment is substantially identical to the apparatus of the second embodiment.

Thus, the arrangement including the thicker projecting pins 16 and 17 having a greater surface area of the projecting portion and hence causing a greater surface tension can increase the attraction force pulling the molten solder H from the first positive and negative terminals 7 and 8, and prevent generation of solder bridging and solder ball in the interspace 11, effectively. It is optional to set the projection length L2 of the thicker projecting pins 16 and 17 substantially equal to the projection length L1 of first positive and negative terminals 7 and 8.

Fifth Embodiment

Figure 7:
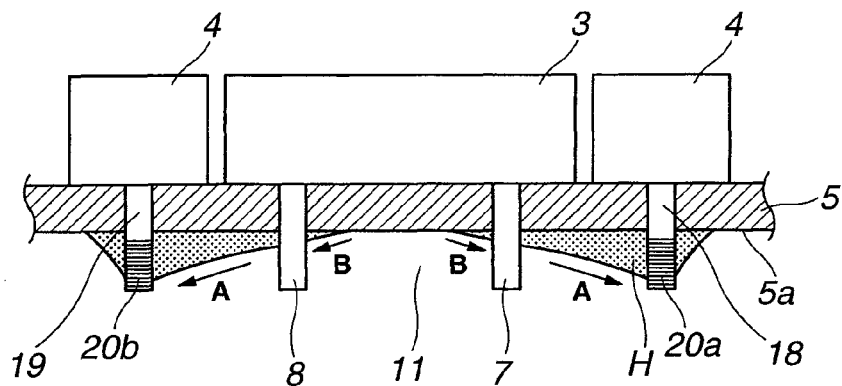
FIG. 7 is a sectional view schematically showing a terminal arrangement according to a fifth embodiment.

FIG. 7 shows an arrangement according to a fifth embodiment of the present invention. The arrangement of FIG. 7 includes second positive and negative terminals 18 and 19 which are projected to have a projection length L2 substantially equal to the projection length L1 of first positive and negative terminals 7 and 8 and which are shaped to have a greater outside surface area of the outer circumferential surface. At least one of the second positive and negative terminals 18 and 19 includes a surface area increasing portion or a surface are increasing means (such as an irregular surface region) for increasing the outside surface area. In the illustrated example, each of the second positive and negative terminals 18 and 19 includes a threaded portion 20a or 20b (or externally threaded portion) to increase the surface area of the outside circumferential surface, and thereby to increase the force attracting the molten solder H from the first positive and negative terminals 7 and 8.

With the surface area increasing portions 20a and 20b, the arrangement according to the fifth embodiment can provide effects similar to those of the second embodiment. Moreover, without the need for increasing the axial length of second positive and negative terminals 18 and 19, the arrangement according to the fifth embodiment can facilitate the production process, reduce the production cost, and improve the yield of the material by setting the projecting length L2 of second positive and negative terminals 18 and 19 substantially equal to the projecting length L1 of first positive and negative terminals 7 and 8.

The surface area increasing portion such as the threaded portion 20a or 20b can be formed in either or both of the projecting pins 12 and 13. In this case, the projecting length L2 of either or both of the projecting pins 12 and 13 may be set equal to the projecting length L1 of first positive and negative terminals 7 and 8. Moreover, the surface area increasing portion 20a or 20b can be formed in the longer projected projecting pins 12 and 13 shown in FIG. 4 or in the projecting member shown in any of FIGS. 3, 4, 5, 6, and 8.

Sixth Embodiment

Figure 8:
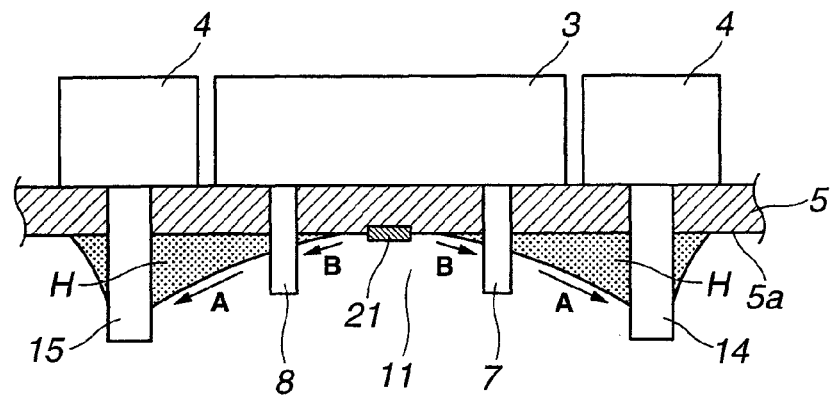
FIG. 8 is a sectional view schematically showing a terminal arrangement according to a sixth embodiment.

FIG. 8 shows an arrangement according to a sixth embodiment of the present invention. Though the arrangement of FIG. 8 is basically identical to the arrangement of FIG. 3 according to the first embodiment, there is provided a silk portion 21 in the interspace 11.

The silk portion 21 (or repelling portion) is a portion of a material repelling the molten solder H. During the soldering operation, the silk portion 21 acts to remove the molten solder H forcibly from the interspace 11. Therefore, the silk portion 21 can cooperate with the attracting force of the second positive and negative terminals 14 and 15 (or 9 and 10), and further increase the effect of preventing solder bridging and formation of solder ball in the interspace 11.

Consequently, the arrangement according to the sixth embodiment makes it possible to further reduce the pitch P of interspace 11 between first positive and negative terminals 7 and 8, and thereby to reduce the electric inductance effectively without using the before-mentioned filter electronic circuit. Therefore, the arrangement of the sixth embodiment can reduce the production cost largely and improve the practical utility.

The invention is not limited to the preceding embodiments. Various modifications and variation are possible within the purview of the present invention. For example, it is possible to employ, as the metallic material of the projecting member, other metallic material having a greater force attracting the molten solder. Furthermore, the surface area increasing means is not limited to the externally threaded portions 20a and 20b. It is possible to make the forward end portion of the projecting member into a plate-like form to increase the surface area by flattening the forward end. The present invention is applicable to various electronic apparatus (such as electronic control apparatus) other than the electronic apparatus for the brake system In the illustrated embodiment, an electronic apparatus such as an electronic control apparatus comprises first and second terminals and a projecting member. The first and second terminals project from a circuit board and lying adjacent to each other with an interspace formed between the first and second terminals. The projecting member projects along a neighboring terminal which is one of the first and second terminals at such a position that the neighboring terminal is located between the projecting member and the interspace. The projecting member is located at an adjacent position adjacent to the neighboring terminal, to attract molten solder from the interspace toward the projecting member during soldering to join the first and second terminals to the circuit board. The electronic apparatus may be further configured in the following manner. Each of the first and second terminals extends through the circuit board from a second (lower) surface to a first (upper) surface (5a) of the circuit board (through a corresponding one of two through holes) and includes a projecting portion projecting from the first surface of the circuit board in a projecting (upward in FIG. 1) direction to a projecting end. The projecting member includes a projecting portion projecting in the projecting direction from the first surface of the circuit board to a projecting end at the adjacent position adjacent to the neighboring terminal which is one of the first and second terminals. A length of the projecting portion of the projecting member from the first surface of the circuit board to the projecting end of the projecting member is not smaller than the length (L1) of the projecting portion of the neighboring terminal from the first surface of the circuit board.

This application is based on a prior Japanese Patent Application No. 2010-211978 filed on Sep. 22, 2010. The entire contents of this Japanese Patent Application are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. An electronic apparatus comprising: first and second terminals projecting from a circuit board and lying adjacent to each other with an interspace formed between the first and second terminals; and a projecting member projecting along a neighboring terminal which is one of the first and second terminals at such a position that the neighboring terminal is located between the projecting member and the interspace, the projecting member being located at an adjacent position adjacent to the neighboring terminal, to attract molten solder from the interspace toward the projecting member during soldering to join the first and second terminals to the circuit board, and the projecting member being connected with the neighboring terminal by a solidified solder body formed by the molten solder attracted toward the projecting member, the solidified solder body having a larger solder body portion adhered to the projecting member having a greater solder attractant surface area in comparison to a smaller solder body portion adhered to the neighboring terminal having a smaller solder attractant surface area.

2. The electronic apparatus as claimed in claim 1, wherein the first and second terminals project from the circuit board in a projecting direction to such a height that the first and second terminals are substantially equal in a projection length from the circuit board; the first and second terminals are connected with the circuit board by soldering; and the projecting member projects in the projecting direction at the adjacent position to attract the molten solder from the interspace toward the projecting member with a surface tension of the molten solder during a process of soldering the first and second terminals to the circuit board.

3. The electronic apparatus as claimed in claim 1, wherein each of the first and second terminals extends through the circuit board from a second surface to a first surface of the circuit board and includes a projecting portion projecting from the first surface of the circuit board in a projecting direction to a projecting end; the projecting member includes a projecting portion projecting in the projecting direction from the first surface of the circuit board to a projecting end at the adjacent position adjacent to the neighboring terminal which is one of the first and second terminals; and a length of the projecting portion of the projecting member from the first surface of the circuit board to the projecting end of the projecting member is not smaller than the length of the projecting portion of the neighboring terminal from the first surface of the circuit board.

4. The electronic apparatus as claimed in claim 3, wherein the length of the projecting portion of the projecting member from the first surface of the circuit board to the projecting end of the projecting member is greater than the length of the projecting portion of the neighboring terminal from the first surface of the circuit board.

5. The electronic apparatus as claimed in claim 3, wherein a surface area of the projecting portion of the projecting member from the first surface of the circuit board to the projecting end of the projecting member is greater than a surface area of the projecting portion of the neighboring terminal from the first surface of the circuit board.

6. The electronic apparatus as claimed in claim 5, wherein the projecting portion of the projecting member from the first surface of the circuit board to the projecting end of the projecting member is shaped to have at least one of a length, a cross sectional size and an irregular surface region to increase the surface area greater than the surface area of the projecting portion of the neighboring terminal from the first surface of the circuit board.

7. The electronic apparatus as claimed in claim 4, wherein the projecting member has a cross sectional size greater than a cross sectional size of the neighboring terminal.

8. The electronic apparatus as claimed in claim 4, wherein the projecting member includes an irregular surface region configured to increase the surface area of the projecting portion of the projecting member.

9. The electronic apparatus as claimed in claim 4, wherein the electronic apparatus further comprises a repelling portion formed in the interspace between the first and second terminals, and arranged to repel the molten solder away from the interspace.

10. The electronic apparatus as claimed in claim 1, wherein the projecting member is a third terminal connected with the neighboring terminal by soldering.

11. The electronic apparatus as claimed in claim 1, wherein the projecting member is a metallic rod fixed to the circuit board.

12. The electronic apparatus as claimed in claim 1, wherein the electronic apparatus is an electronic control apparatus comprising the circuit board formed with an electronic circuit including at least one electronic component, a connector to connect the circuit board electrically with an external device, and a casing enclosing the circuit board.

13. The electronic apparatus as claimed in claim 1, wherein the projecting member is a first projecting member which projects along the first terminal at an adjacent position adjacent to the first terminal, to attract the molten solder, during soldering, from the interspace toward the first projecting member, the first terminal being located between the interspace and the first projecting member; and the electronic apparatus further comprises a second projecting member which projects along the second terminal at an adjacent position adjacent to the second terminal, to attract the molten solder, during soldering, from the interspace toward the second projecting member, the second terminal being located between the interspace and the second projecting member.

14. The electronic apparatus as claimed in claim 13, wherein the first and second projecting members are metallic projecting pins fixed to the circuit board.

15. The electronic apparatus as claimed in claim 13, wherein the first projecting member is an outer positive terminal connected with the first terminal which is an inner positive terminal, and the second projecting member is an outer negative terminal connected with the second terminal which is an inner negative terminal.

16. An electronic apparatus comprising:
first and second terminals projecting from a circuit board and lying adjacent to each other with an interspace formed between the first and second terminals;
a projecting member projecting along a neighboring terminal which is one of the first and second terminals, at such a position that the neighboring terminal is located between the projecting member and the interspace, the projecting member being located at an adjacent position adjacent to the neighboring terminal, and having a greater solder attractant surface area than a solder attractant surface area of the neighboring terminal, and
a solidified solder body joining the projecting member and the neighboring terminal, and having a larger solder body portion adhered to the projecting member having the greater solder attractant surface area, in comparison to a smaller solder body portion adhered to the neighboring terminal.

17. An electronic apparatus comprising:
first and second terminals projecting from a circuit board and lying adjacent to each other with an interspace formed between the first and second terminals;
a projecting member projecting along a neighboring terminal which is one of the first and second terminals, at such a position that the neighboring terminal is located between the projecting member and the interspace, the projecting member being located at an adjacent position adjacent to the neighboring terminal, and projecting farther from a major planar surface of the circuit board than the neighboring terminal, to have a greater solder attractant surface area than a solder attractant surface area of the neighboring terminal, and
a solidified solder body joining the projecting member and the neighboring terminal, and having a larger solder body portion adhered to the projecting member having the greater solder attractant surface area, in comparison to a smaller solder body portion adhered to the neighboring terminal.

\* \* \* \* \*